(12) United States Patent
Anand et al.

(10) Patent No.: US 7,917,806 B2
(45) Date of Patent: Mar. 29, 2011

(54) SYSTEM AND METHOD FOR INDICATING STATUS OF AN ON-CHIP POWER SUPPLY SYSTEM (75) Inventors: Darren L. Anand, Williston, VT (US); John A. Fifield, Underhill, VT (US); Kevin W. Gorman, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 591 days.

(21) Appl. No.: 11/958,680

(22) Filed: Dec. 18, 2007

(65) Prior Publication Data
US 2009/0158092 A1 Jun. 18, 2009

(51) Int. Cl.
G06F 11/00 (2006.01)

(52) U.S. Cl. .......................................... 714/22
(58) Field of Classification Search ............ 714/22; 713/300
See application file for complete search history.

(56) References Cited

U.S. PATENT DOCUMENTS

| | | | |
|---|---|---|---|
| 4,093,985 A | | 6/1978 | Das |
| 4,234,920 A * | | 11/1980 | Van Ness et al. ............. 714/22 |
| 4,584,673 A | | 4/1986 | Kuijk |
| 4,639,864 A * | | 1/1987 | Katzman et al. ............. 714/14 |
| 4,819,205 A | | 4/1989 | McRoberts |
| 5,283,792 A * | | 2/1994 | Davies et al. ................. 714/22 |
| 5,317,704 A | | 5/1994 | Izawa et al. |
| 5,333,309 A * | | 7/1994 | Hibi .............................. 714/22 |
| 5,392,292 A | | 2/1995 | Davis et al. |
| 5,436,731 A * | | 7/1995 | Miura ........................... 358/409 |
| 5,737,616 A * | | 4/1998 | Watanabe ..................... 713/340 |
| 5,996,079 A * | | 11/1999 | Klein ............................ 713/300 |
| 6,263,453 B1 * | | 7/2001 | Anderson ..................... 714/22 |
| 6,550,017 B1 * | | 4/2003 | Moiin et al. .................. 714/4 |
| 6,748,519 B1 | | 6/2004 | Moore |
| 6,965,300 B2 * | | 11/2005 | Lee ........................... 340/309.16 |
| 7,243,261 B2 * | | 7/2007 | Yashiro ........................ 714/14 |
| 7,295,051 B2 * | | 11/2007 | Li et al. ........................ 327/143 |
| 7,337,357 B2 * | | 2/2008 | Cagno et al. ................. 714/14 |
| 7,581,137 B2 * | | 8/2009 | Okada et al. ................. 714/24 |
| 7,607,043 B2 * | | 10/2009 | Crawford et al. ............ 714/22 |
| 7,676,693 B2 * | | 3/2010 | Otsuka et al. ................ 714/23 |
| 2003/0101373 A1 * | | 5/2003 | Freyman et al. ............. 714/14 |
| 2004/0019814 A1 * | | 1/2004 | Pappalardo et al. ......... 713/300 |
| 2005/0160316 A1 * | | 7/2005 | Shipton ........................ 714/22 |
| 2008/0082850 A1 * | | 4/2008 | Otsuka et al. ............... 713/340 |

* cited by examiner

*Primary Examiner* — Robert Beausoliel
*Assistant Examiner* — Amine Riad
(74) *Attorney, Agent, or Firm* — Cantor Colburn LLP; Michael LeStrange (57) ABSTRACT

The status of multiple on-chip power supply systems is indicated for use in modifying chip test flow and diagnosing chip failure. Digital compliance signals are received, each compliance signal associated with one of multiple on-chip power supplies. Each power supply has an associated compliance level, and each compliance signal indicates whether its associated power supply is operating at the associated compliance level. The compliance signals are converted into a power supply status signal indicating status of the compliance signals associated with the power supply. The power supply status signal is output. If a power supply is operating at its associated compliance level, the output power supply status signal indicates that the power supply is passing. If the power supply is not operating at its associated compliance level, the output power supply status signal indicates that the power supply is failing. If a power supply is failing, a memory test may be aborted, simplifying chip failure diagnosis.

18 Claims, 10 Drawing Sheets

SYSTEM AND METHOD FOR INDICATING STATUS OF AN ON-CHIP POWER SUPPLY SYSTEM

BACKGROUND

The present invention relates generally to power systems, and, more particularly, to indicating status of an on-chip power supply system.

On-chip power systems for integrated circuits have become increasingly popular as they eliminate the need for providing several different voltage levels from external sources. It is common to have several power systems serving several memory sub-systems.

As one example, in a chip including memory macros, such as an embedded dynamic random memory (eDRAM) chip, it is necessary to provide many different voltage levels to effectively achieve performance. For example, there needs to be one voltage level (VPP) to provide a voltage greater than supply voltage Vdd, for a boosted wordline operation to enhance cell signal and access time. A negative voltage, (VBB), is needed to bias the body of the transfer devices in the memory array so that sub-threshold leakage of the cell is minimized. In some memory chip designs there may also be an additional negative voltage (VWL) to hold unselected wordlines to a level below ground so that the sub-threshold leakage of the array devices can be suppressed to improve cell retention. Additionally, a bandgap reference voltage (VBGR) is needed to provide a constant and stable reference voltage insensitive to variations in the supply voltage Vdd, and temperature. Another voltage reference (VREFDC), which varies with the supply voltage, is needed to generate voltage levels which are designed to track the supply voltage. Another bandgap circuit output is constant current reference (VCMN), which may be used to bias differential amplifiers, etc.

Diagnostics become difficult in an Application Specific Integrated Circuit (ASIC) chip having several power systems serving several memory sub-systems because the power system voltages are not observable at test. Internal probing of a failed chip is not practical under several metal levels, and consequently, field failures are presently very difficult to diagnose.

Thus, there exists a need for a technique for simply and effectively diagnosing failures in on-chip power supply systems.

SUMMARY

According to exemplary embodiments, systems and a method are provided for indicating status of an on-chip power supply system for improving test flow and diagnosing of chip failure.

According to one embodiment, a system is provided for indicating status of an on-chip power supply system including multiple power supplies. The system includes a power system status register for receiving digital compliance signals. Each compliance signal is associated with one of the multiple power supplies. Each power supply has an associated compliance level, and each compliance signal indicates whether its associated power supply is operating at the associated compliance level. The power system status register also generates a power supply status signal based on the digital compliance signals. The power supply status signal indicates status of the compliance signals associated with the power supplies. The system further includes an output for outputting the power supply status signal. If a power supply is operating at its associated compliance level, the power supply status signal indicates that the power supply is passing, and if a power supply is not operating at its associated compliance level, the power supply status signal indicates that the power supply is failing.

According to another embodiment, a system for indicating status of an on-chip power supply system including multiple power supplies also includes a sequencer circuit for activating the multiple power supplies in a predetermined order. The sequencer circuit provides a digital compliance signal for each power supply indicating whether the power supply is operating at an associated compliance level. The system further includes an analog-to-digital converter for converting analog signals indicating operating levels of power supplies into digital compliance signals indicating whether the power supplies are operating at associated compliance levels. The power system status register is coupled to the sequencer circuit and the analog-to-digital converter for receiving the digital compliance signals. The power system status register generates a power supply status signal based on the digital compliance signals. The power supply status signal indicates status of the compliance signals associated with the power supplies. If a power supply is operating at its associated compliance level, the power supply status signal indicates that the power supply is passing, and if the power supply is not operating at its associated compliance level, the power supply status signal indicates that the power supply is failing. A Built-in Self Test (BIST) receives the power supply status signal via a latched interface or a scan chain and performs tests on memories on the chip based on the power supply status signal.

According to another embodiment, a method is provided for indicating status of an on-chip power supply system including multiple power supplies. The method includes receiving digital compliance signals, each compliance signal associated with one of the multiple power supplies, and each power supply having an associated compliance level. Each compliance signal indicates whether its associated power supply is operating at the associated compliance level. A power supply status signal is generated based on the digital compliance signals, the power supply status signal indicating status of the compliance signals associated with the power supplies. The power supply status signal is output. If a power supply is operating at its associated compliance level, the power supply status signal output indicates that the power supply is passing, and if the power supply is not operating at its associated compliance level, the power supply status signal output indicates that the power supply is failing.

BRIEF DESCRIPTION OF THE DRAWINGS

Referring to the exemplary drawings, wherein like elements are numbered alike in the several Figures.

DETAILED DESCRIPTION

According to exemplary embodiments, the health of the boosted supplies and analog voltage levels present in an on-chip power system may be easily tested and diagnosed based on a status signal indicating the status of on-chip power supplies. The systems and method described herein eliminate the need for internal probing to diagnose a field failure. A memory sparing technique is also made possible based on the status signal indicating the status of the power supply system.

The description below is directed toward embedded memory circuits and, more specifically, to embedded DRAM (eDRAM) circuits. However, it should be understood that the invention is not limited to eDRAM circuits but is applicable to all circuits making use of on-chip power systems.

Figure 1:
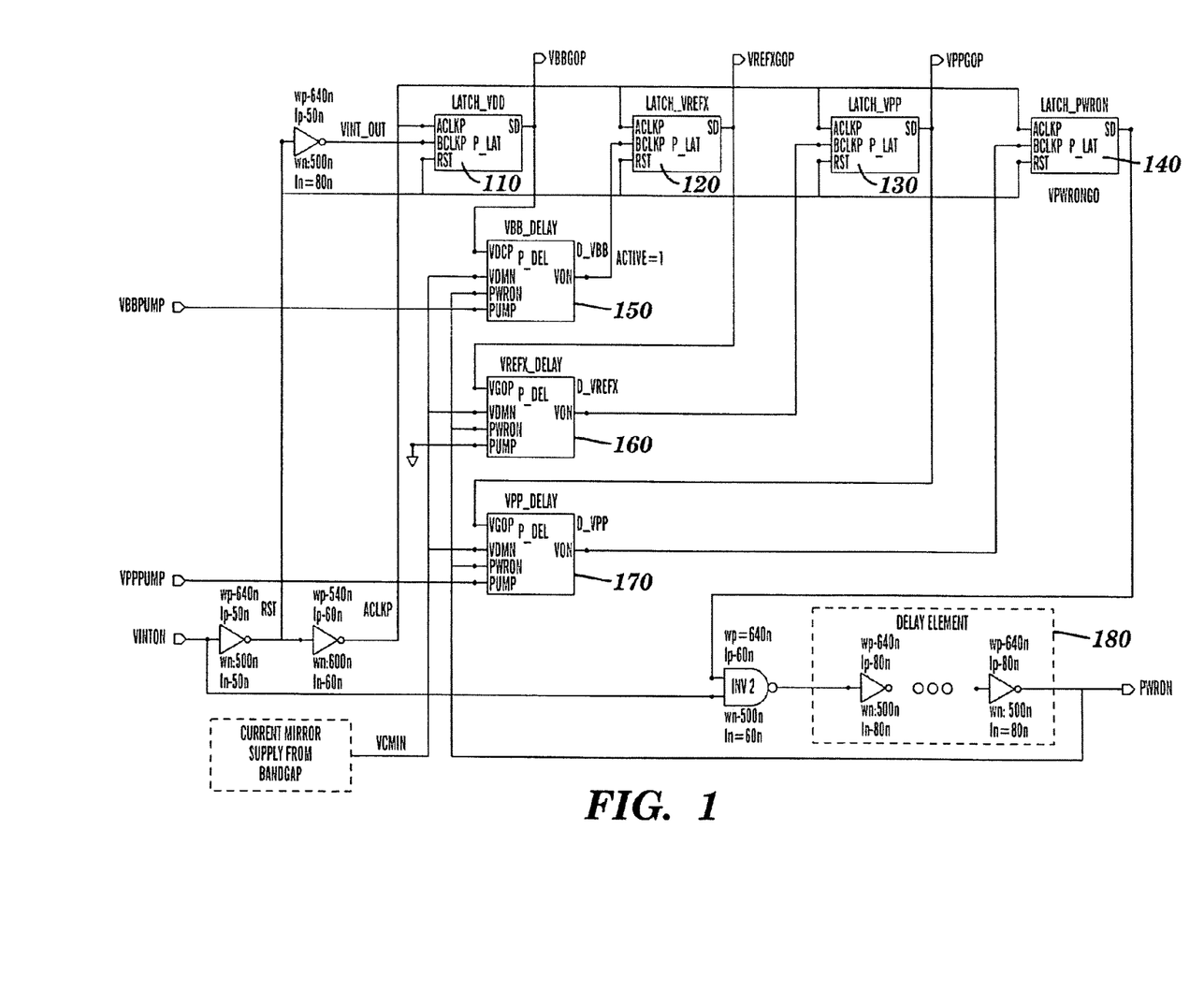
FIG. 1 illustrates a latched sequencer circuit for an on-chip power supply system according to an exemplary embodiment.
Figure 2:
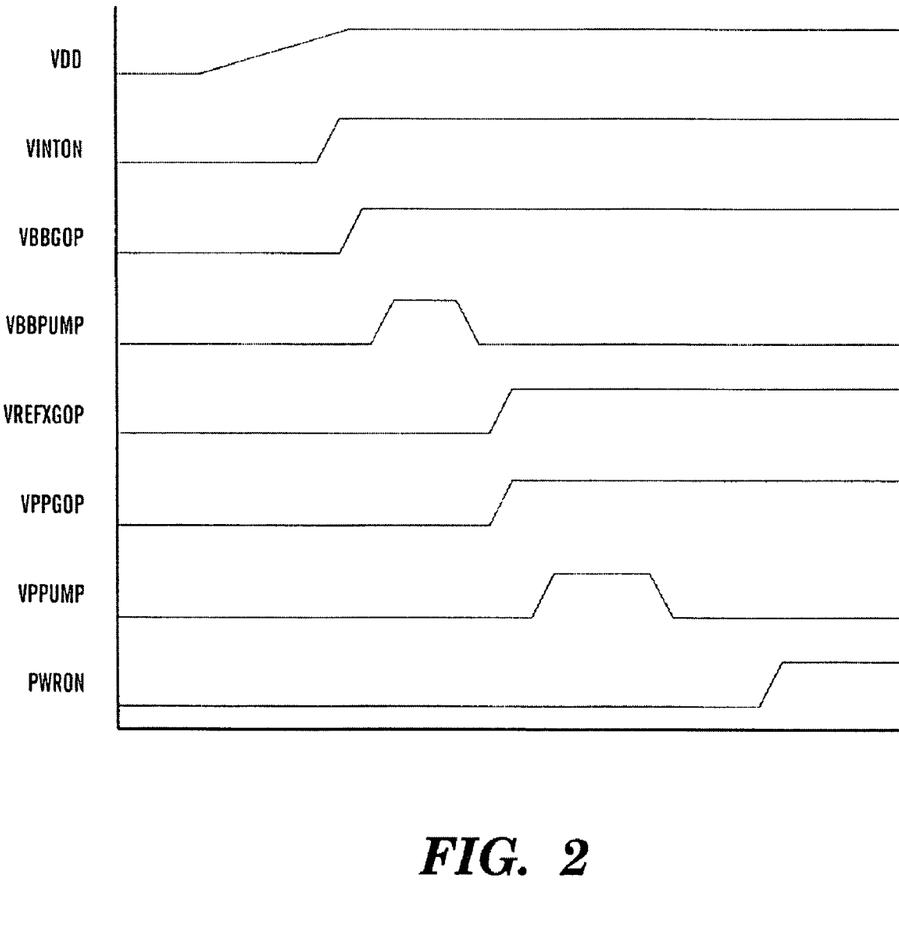
FIG. 2 illustrates signals used in a latched sequencer circuit, such as that shown in FIG. 1, according to exemplary embodiments.
Figure 3:
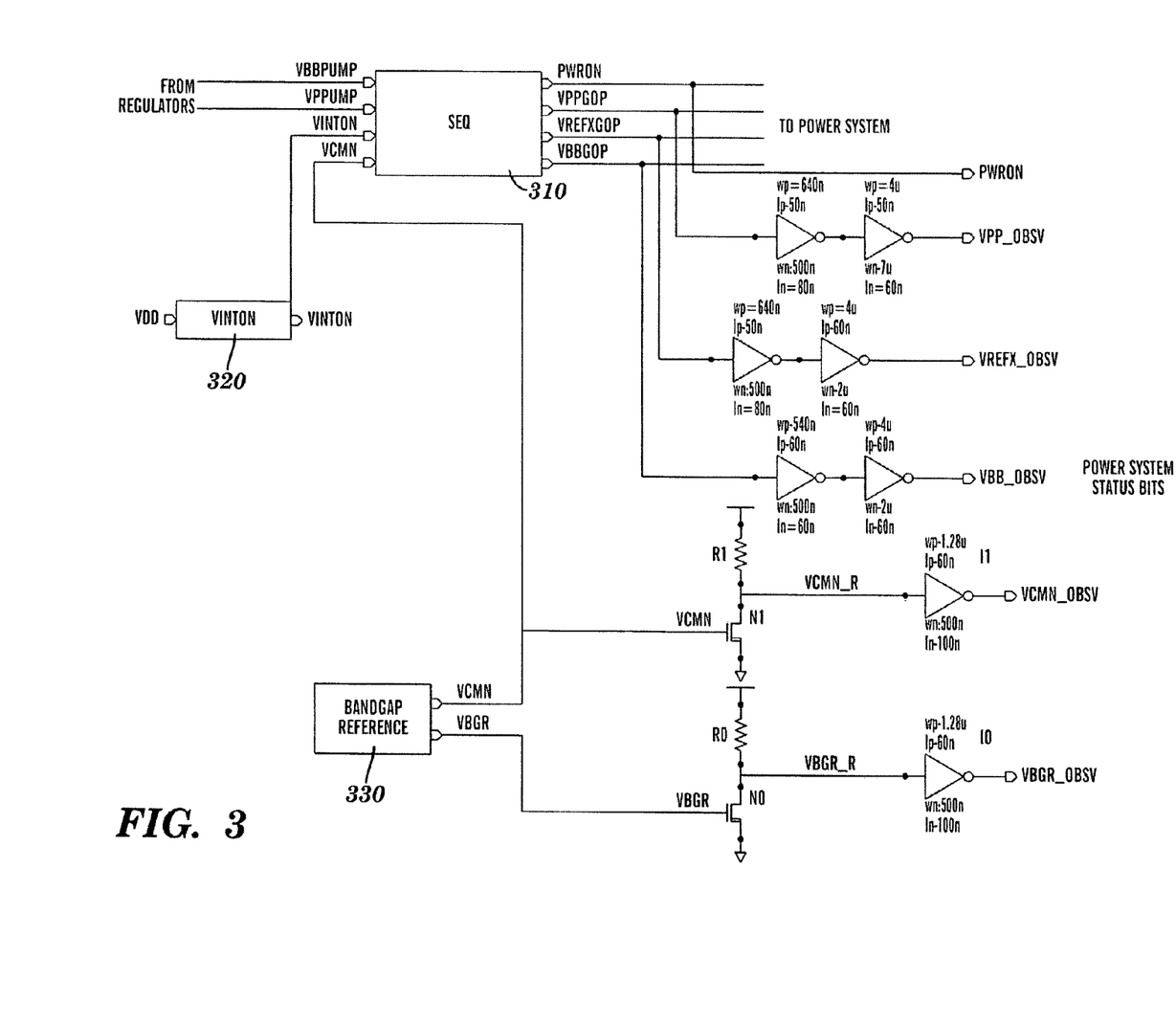
FIG. 3 is a block diagram of output circuits for an on-chip power supply system according to exemplary embodiments.

Described below with reference to FIGS. 1-3 is an exemplary embodiment of a system for indicating status of an on-chip power supply system including multiple power supplies. A status signal, also referred to as a compliance signal, is generated indicating whether a power supply is operating at its compliance level. The compliance signals may be used as input to a BIST system.

FIG. 1 shows a latched sequencer circuit for an on-chip power supply system. Signals used in the circuit of FIG. 1 are described below with reference to FIG. 2. Sequencing ensures that activation of the negative power supplies precede the activation of the positive supplies to prevent forward biasing of PN junctions and to restrict the chip power-up to a predictable sequence. According to an exemplary embodiment, a bandgap reference circuit is enabled as soon as power is available to it to generate a reference voltage VBGR and a current mirror supply VCMN.

Referring to FIG. 1, VINTON is an active high signal from a Vdd-ON detector. The Vdd-ON detector issues a power-on signal (VINTON) when Vdd reaches about 0.7V, or about 70% of its nominal value. VINTON is fed to latches 110, 120, 130, and 140 via inverters and to delay element 180. VPPUMP is an active high signal from a regulator that activates a positive pumped supply generator VPP. VPPUMP is fed to a VPP_DELAY 170. VBBPUMP is an active high signal from a regulator that activates a negative pumped supply generator VBB. VBBPUMP is fed to VBB_DELAY element 150. VBBGOP is an active high signal output that enables the VBB pump system. VBBGOP is fed to VBB_DELAY element 150, along with VBBPUMP and VCMN from a current mirror. For further details of operations of a delay element using a current supply VCMN, the reader is directed to U.S. Pat. No. 6,348,827, herein incorporated by reference. VREFXGOP is an active high output which activates a VREFX voltage system.

VREFXGOP is fed to VREFX_DELAY element 160, along with VCMN. VPPGOP is an active high output that activates the VPP pump system. VPPGOP is fed to VPP_DELAY element 170, along with VCMN. PWRON is an active high output that indicates that activation of the multiple power supply system is complete. PWRON is generated as an output of a delay element 180, and is fed back as an input to delay elements 150, 160 and 170.

The VINTON signal is the first input to the Power-on sequencer and when initially low, the L1/L2 latch elements (Latch_VBB 110, Latch_VREFX 120, Latch_VPP 130 and Latch_PWRON 140) are in the '0' state. When VINTON goes high to indicate Vdd is on, the Latch_VBB element 110 latches a '1' state, and VBBGOP output goes high to start the −0.5V VBB system. When the VBB system reaches its target level, the VBBPUMP signal goes low, and after a short delay, this sets the Latch_VREFX 120 to the high state to activate VREFXGOP.

According to one embodiment, the VREFX level is a regulated positive voltage (e.g., 0.45 V), and there is no comparator device to judge when it is at its specified level. Therefore, the "PUMP" input to the corresponding VREFX-delay element is simply grounded. Once VREFXGOP is activated, the VPPGOP signal is also activated (with the Latch_VPP 130 set to the high state), after a short delay, to enable the 1.7V VPP system. When the VPP pump attains an output level of about 1.7V, the VPPUMP signal goes low, which sets the Latch_PWRON 140 to a high state.

The latch output VPWRONGO from Latch_PWRON 140, is delayed by a delay element 180, and is output as PWRON. Signal PWRON going high indicates all power systems are up and running. This is further illustrated in FIG. 2.

FIG. 3 is a block diagram of the output circuits for an on-chip power supply system that provides a digital signal indicating the presence of several analog voltage nodes and an overall system status. VBBPUMP, VPPPUMP, VINTO, and VCMN are received in a sequencer 310, such as the sequencer shown in detail in FIG. 1. PWRON, VPPGOP, VREFXGOP and VBBGOP are output from the sequencer 310 to control activation of power supplies as described above. Digital power system status outputs are provided, e.g., to a scan chain and input to the BIST system to indicate the status of various power supplies. These power system status outputs include PWRON, VPP_OBSV (Wordline Voltage Supply), VREFX_OBSV (Reference level), VBB_OBSV (Back Bias Voltage Supply) VCMN_OBSV (current supply reference), and VBGR_OBSV (Bandgap Voltage Reference). The current supply reference and bandgap voltage reference are intermediate analog voltage levels and are not governed by a comparator and regulator circuit, so no latched digital signal is available to indicate their status. Instead, an analog-to-digital converter is formed from a pair of class-A amplifiers formed by N0 and N1, resistors and R0 and R1, and inverters I0 and I1, which output a digital '0' level when analog input levels are low, and output a digital '1' when the analog voltage levels are present. The NFET current levels of N0 and N1, and resistor values of R0 and R1 are chosen so as to provide a drain voltage level sufficient to switch the buffering inverter when VCMN and VBGR inputs are at their proper voltage levels, i.e., 0.43V and 0.55V respectively. A more precise detector may be made from a comparator circuit, but this simplified approach is adequate.

According to an exemplary embodiment, the digital power supply system status outputs (also referred to as digital compliance signals) described above may be provided as bits, with a "1" indicating operation of a power supply at its associated compliance level, and a "0" indicating the power supply is not operating at its compliance level. These signals, in turn, may be provided to a BIST, either as a single "master" value or as a set of individual signals. If all the power supply status signals (compliance signals) are "1", this indicates that the power supplies are all passing. If any one of the power supply status signals is "0", this indicates that one of the power supplies is failing. According to one embodiment, if one power supply is failing, all are considered to be failing for BIST memory testing purposes. In this embodiment, the BIST may be sent a single master signal indicating passing or failing of the power supplies by performing a logical AND operation on the power supply signals, or the BIST may receive multiple power supply status signals and determine passage or failure based on whether one of the power supply status signals is a "0".

Described below and with reference to FIGS. 4-9B are exemplary embodiments for storing, accessing, and using observable power supply status signals in a digital logic based test environment.

Figure 4:
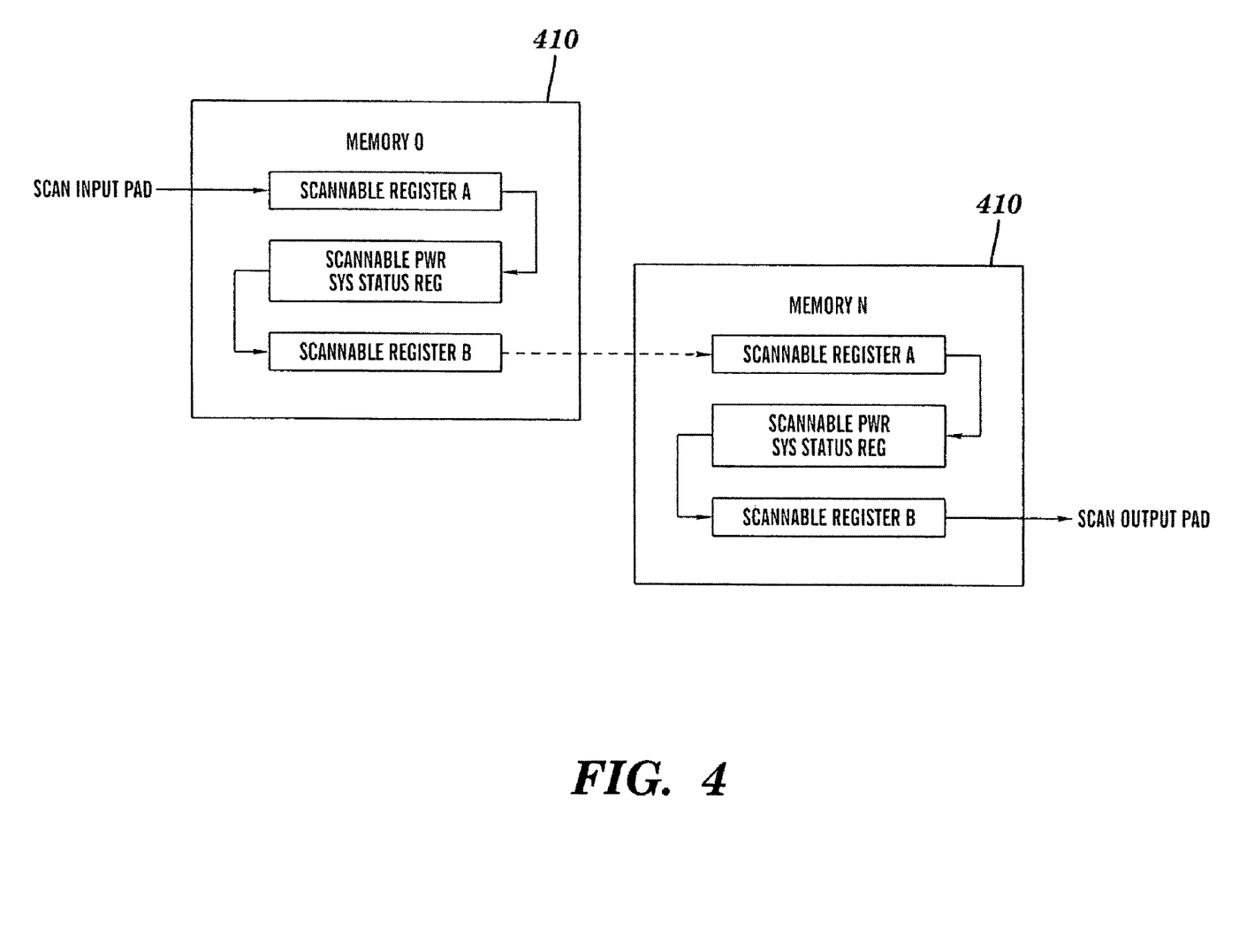
FIG. 4 illustrates a scalable power system status register shown as part of a chip level scan chain according to an exemplary embodiment.

FIG. 4 illustrates a scannable power system status register shown as part of a chip level scan chain according to one embodiment. The power supply system status output bits are captured by latches using a free running clock, such that any change in power system status may be observed and stored in the latches, and the health or status of the power system can be assessed at multiple points in a chip's lifetime by simply accessing the latches (checking during/after manufacturing test, in the field, or following field returns). In the simplest configuration, these latches may be part of a standard scan chain including memories 0-N. As shown in FIG. 4, each memory 410 in the chain receives a scan input in a scannable register A, passes the scan input to a scannable power system status register, and then passes that output to a scannable register B. The scan is output from the scannable register B to other memories in the chain and finally output from the last memory in the chain, memory N. This configuration allows for the latch status to be observed off chip via a simple scan operation, allowing for the assessment of the power system at any point during a chip's operation. A potential disadvantage of this configuration is that a scan operation may interrupt chip operations and can be destructive of chip test states (such that any testing in progress when a scan operation is performed may need to be re-started from the beginning).

Figure 5:
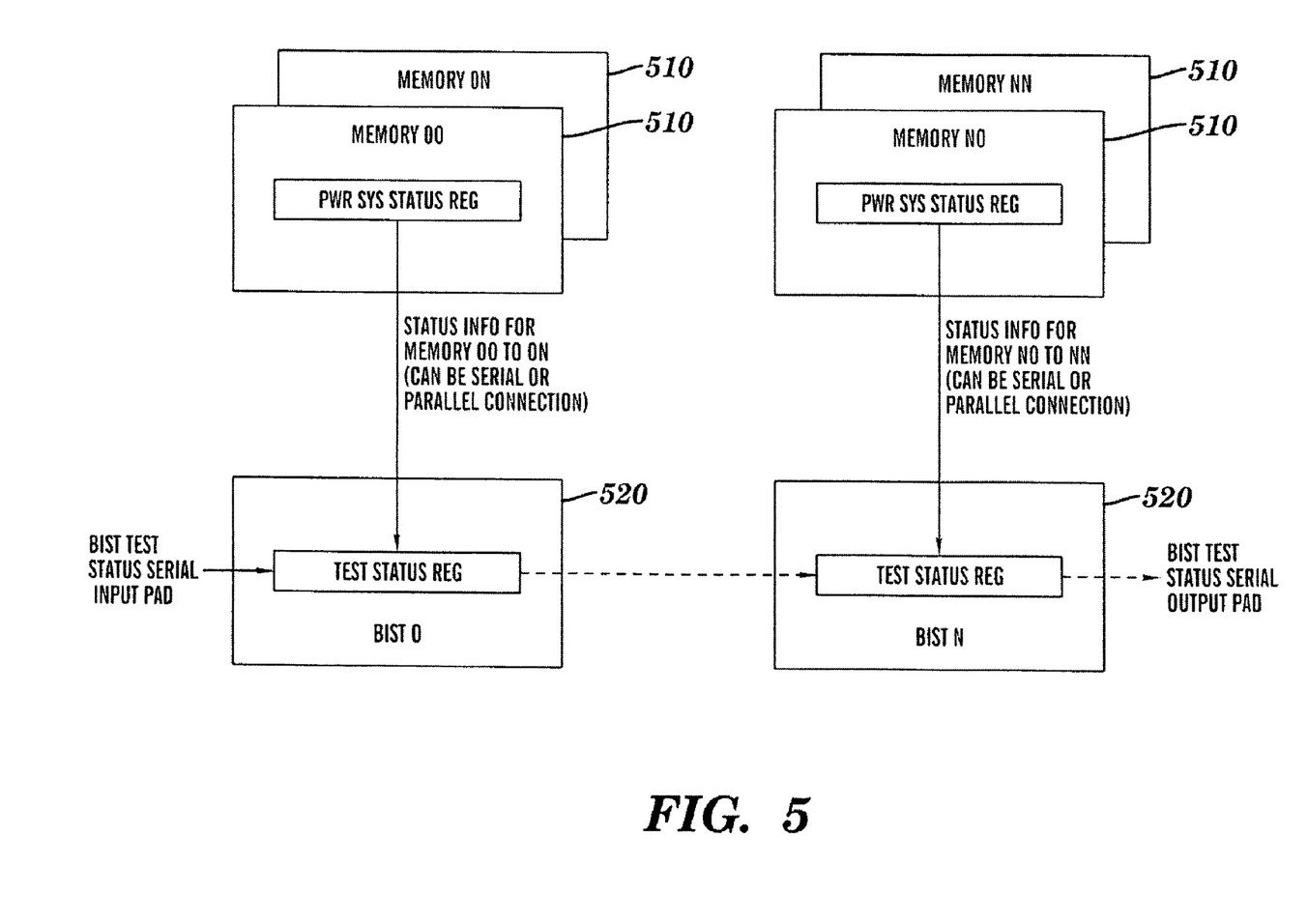
FIG. 5 illustrates a Built-in Self Test (BIST) status register capturing power supply system status according to an exemplary embodiment.

FIG. 5 illustrates a configuration in which the power system status stored in these observation latches in memories is made available to BIST logic according to another embodiment. In FIG. 5, power system status information for memories under test 510 is stored in a power system status register. The power system status information may be delivered via a parallel or serial connection between the memories under test 510 and corresponding BISTs 520. The power system status information is stored in test status registers in the BISTs. Though the configuration in FIG. 5 shows a parallel connection between the memories 510 and the BISTs 520, it should be appreciated that the latch information may be presented as part of a serial shift chain. Either method allows for the power supply status information to be transferred to the BISTs.

Each BIST test status register 520 may be connected in a serial shift chain with all other BIST engines on a chip. This makes it possible to obtain status information obtained via a non-destructive shift of only the test status registers without disturbing other latches on the chip during the shift operation.

The power system status of memories tested by all BIST engines on a chip can be collected in each BIST and then serially shifted off chip. As explained above, an advantage of this over a normal scan operation is that only the status information stored in the BIST engine is serially unloaded off chip, preserving the state of all other latches (and consequently the current test state) of the chip. This allows for nondestructive monitoring of the power system status, without needing to restart testing following a scan operation.

Figure 6:
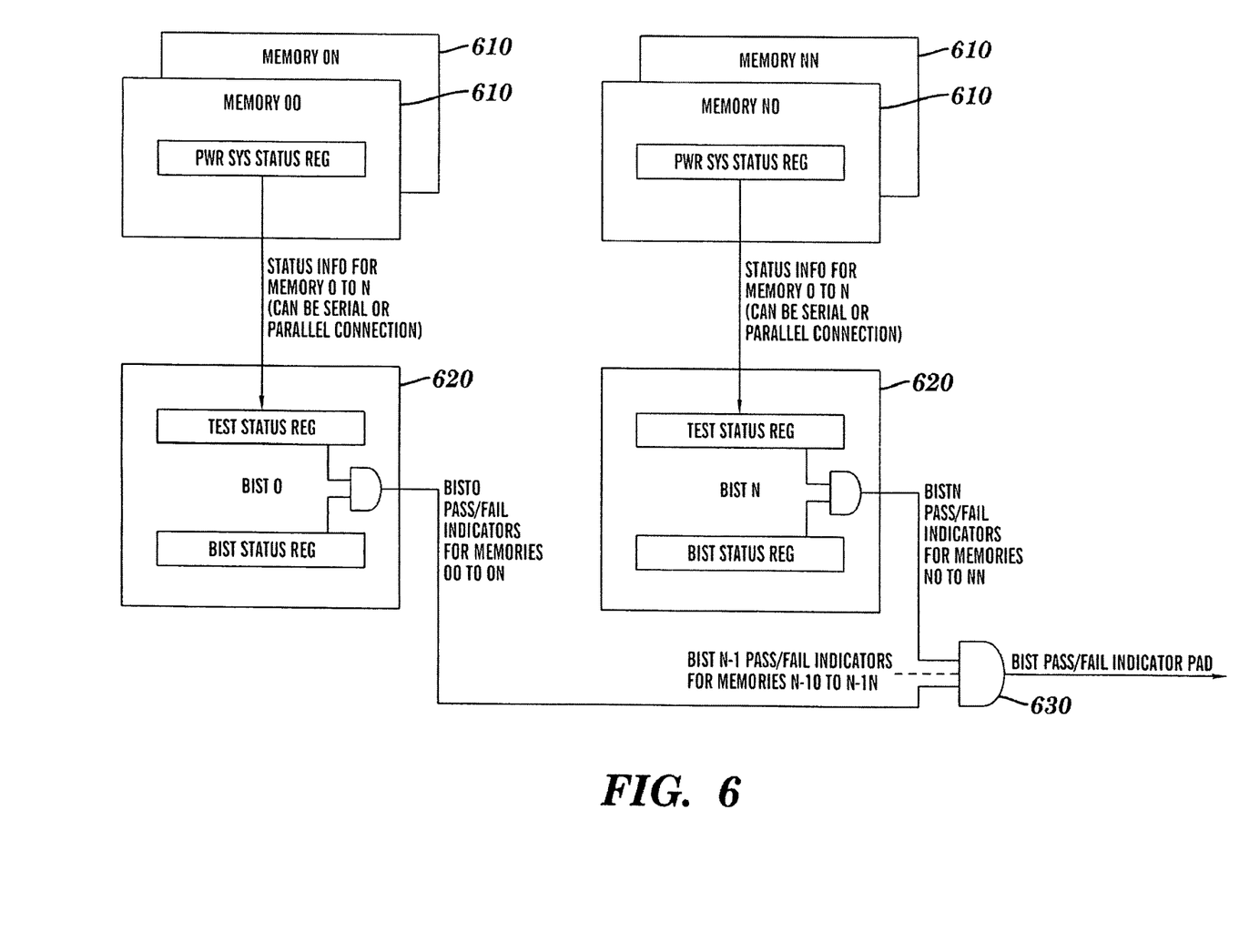
FIG. 6 illustrates individual BIST status registers indicating pass/fail status on a memory basis according to an exemplary embodiment.

The power system status information can be combined with the BIST memory test status information in a configuration such as that depicted in FIG. 6. Each BIST engine 620 provides a pass/fail indicator. If data read from a memory under test 610 is found to be failing at any point during the BIST generated test sequence, the BIST pass/fail indicator may be asserted indicating a fail.

According to an exemplary embodiment, the pass/fail indicator for all BIST engines on a chip are logically combined via, e.g., comparator 630, such that if any power supply or memory is found to be failing, the chip will output a "memory test failed" status flag. If the status flag indicates a memory test failure, then the memory test can be aborted, saving test time by not running the full test sequence on chips with known bad memories. By combining the power system status information with the BIST pass/fail indicator, a memory with a bad power system can be marked as failing as soon as a BIST test begins, removing the need to perform any memory read/write operations, and saving valuable test time.

Figure 7:
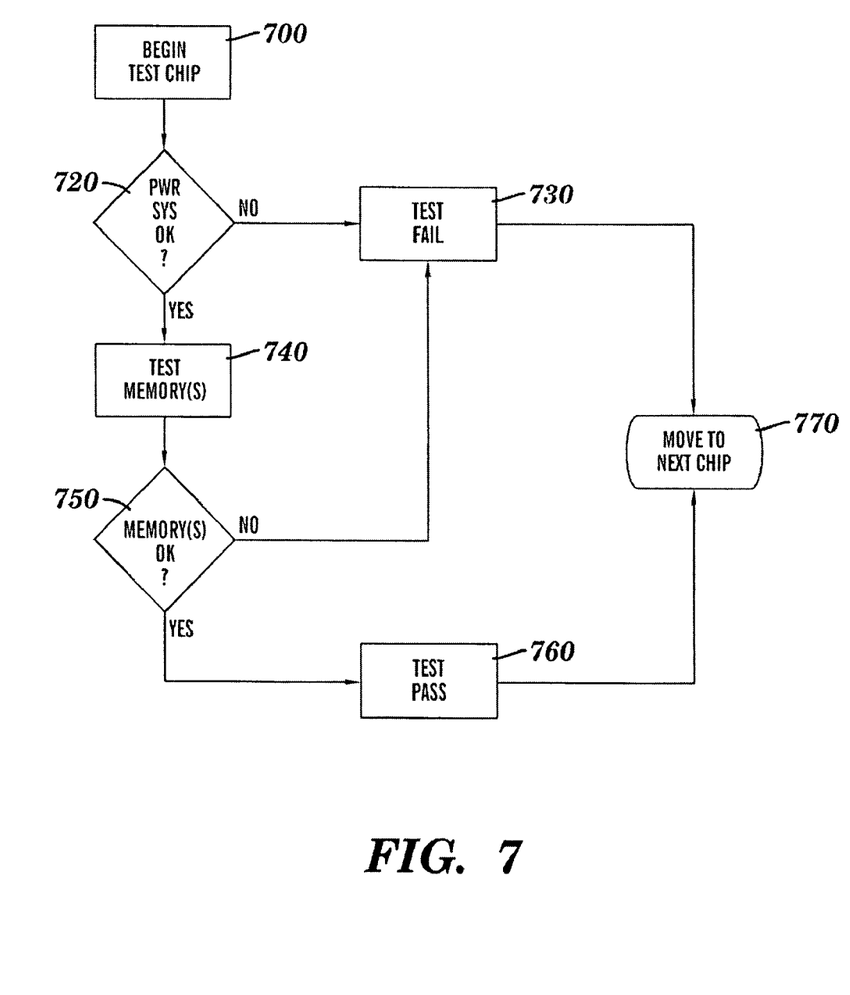
FIG. 7 is a flow chart showing a chip test flow using power supply system status according to an exemplary embodiment.

FIG. 7 is a flow chart depicting a chip test flow that uses power supply system status to determine whether a test passes or fails. Referring to FIG. 7, a test flow begins at step 710. At step 720, a determination is made whether the power system is OK, i.e., whether the power supply status signal generated as described above indicates that the power supplies are operating at their compliance levels. For simplicity of illustration, the steps involved in generating the power supply status signal are omitted here. If, at step 720, the power supply system is not determined to be OK, the test fails at step 730. If the power system is determined to be OK, memory on the chip is tested at step 740. A determination is made at step 750 whether the memory is OK. If not, the test fails at step 730. Otherwise, the test passes at step 760. From step 730 or step 760, the process proceeds to step 770, at which testing moves to another chip.

In the flow chart shown in FIG. 7, if a power supply system is not operating correctly, then a chip can be marked as failing, and testing can be aborted immediately. This saves time and resources, as there is no need then to run any actual memory write/read test sequences to diagnose chip problems.

Figure 8:
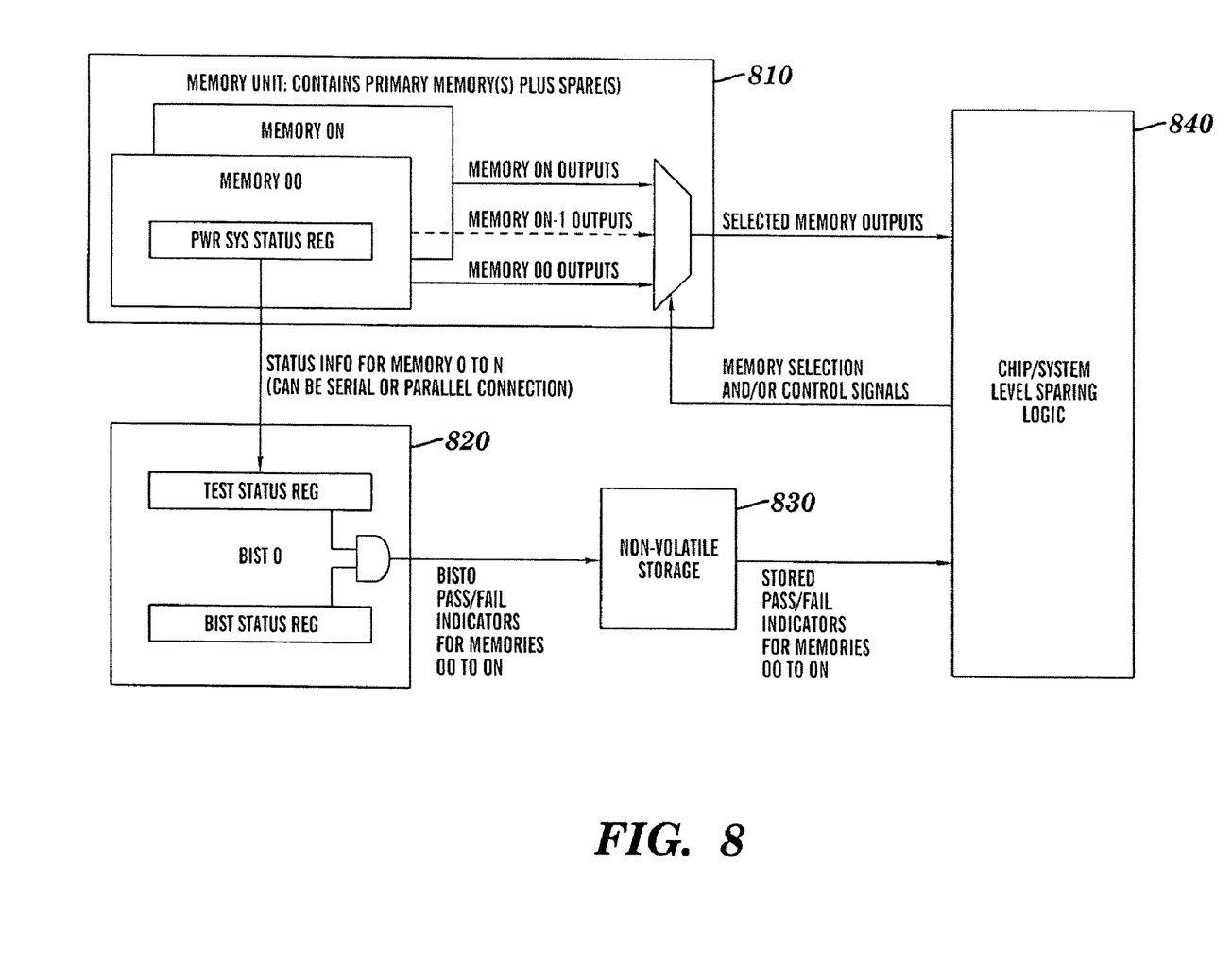
FIG. 8 illustrates a memory sparing arrangement according to an exemplary embodiment.

Referring back to FIG. 6, if data read from a memory under test 610 is found to be failing at any point during the BIST generated test sequence, the BIST pass/fail indicator may be asserted indicating a fail. Additionally, the pass/fail indicator can be used to mark individual failing memories in a more permanent manner in a configuration such as that shown in FIG. 8. In FIG. 8, pass fail indicators of memories 810 are communicated from a BIST 820 to a non-volatile storage 830, such as a fuseable latch. If any memory is found to be failing during test, this information may be permanently set in the storage 830. Upon in-system power up, the health of all memories 810 on a chip is then available immediately to chip/system level sparing logic 840. This allows chip designers to improve yield by only requiring that a certain number of memories on a chip be in working condition. The chip/system level sparing logic 840 may communicate with the memory 810 containing primary memories and spare memories to select spare memories to be used in place of failing memories while still producing a working chip. By combining the power system status with the normal BIST pass/fail indicator, a system for utilizing spare chip memories can be implemented that emphasizes the use of memories with fully robust power systems.

Figures 9, 9A:
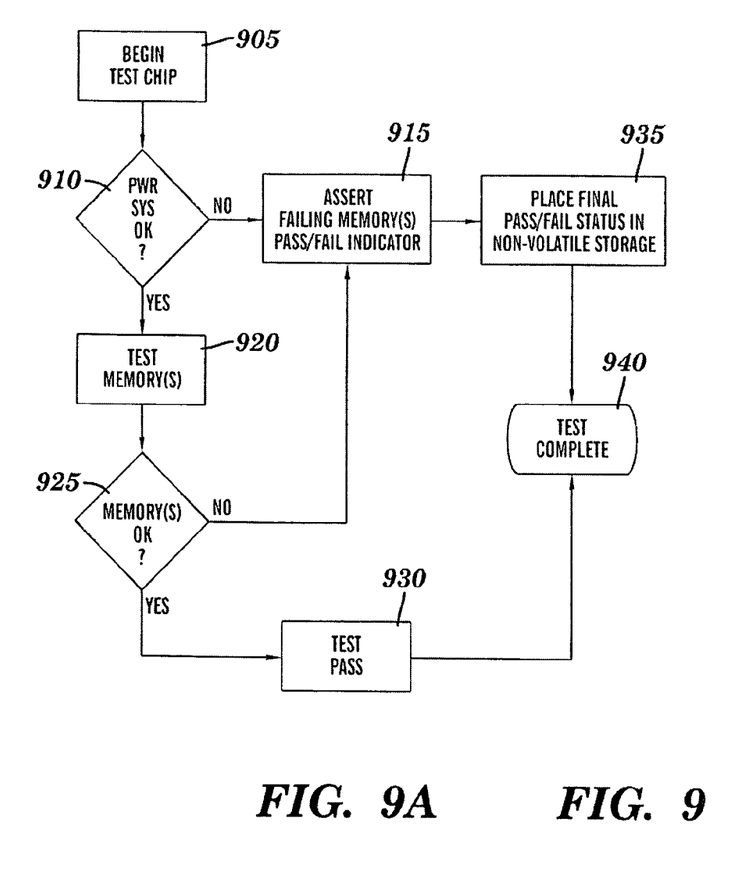
FIG. 9A is a flow chart showing a chip test flow using power system status and memory pass/fail indicators according to an exemplary embodiment.

FIG. 9A is a flow chart showing a chip test flow using power system status and memory pass/fail indicators according to an exemplary embodiment. Referring to FIG. 9A, the test flow begins at step 905. At step 910, a determination is made whether the power system is OK based on the power supply system status signal generated as described above. If the power system is not OK, a failing memory/memories pass/fail indicator is asserted at step 915. If the power system is determined to be OK at step 910, the memory on the chip is tested at step 920. If the memory is not OK, the process proceeds to step 915, at which a failing memory/memories pass/fail indicator is asserted. If the memory is determined to be OK at step 925, the test passes at step 930 at which an indication is asserted that the memory test has passed, and the test is completed at step 940. From step 915, the final pass/fail status indicator for failing memory/memories is placed in non-volatile storage at step 935, and the test is completed at step 940.

Figure 9B:
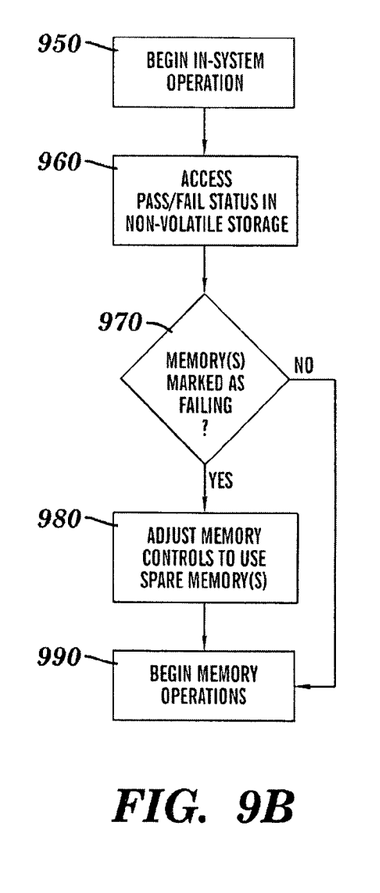
FIG. 9B is a flow chart showing in-system operation of a memory system using spare memories according to an exemplary embodiment.

FIG. 9B is a flow chart showing in-system operation of a memory system using spare memories according to an exemplary embodiment. Referring to FIG. 9B, in-system operation begins at step 950. At step 960, pass/fail status is accessed from the non-volatile storage. At step 970, a determination is made whether there is memory on the chip marked as failing. If not, memory operations are begun at step 990. Otherwise, memory controls are adjusted to use spare memories at step 980, and then memory operations are begun at step 990.

Figure 10:
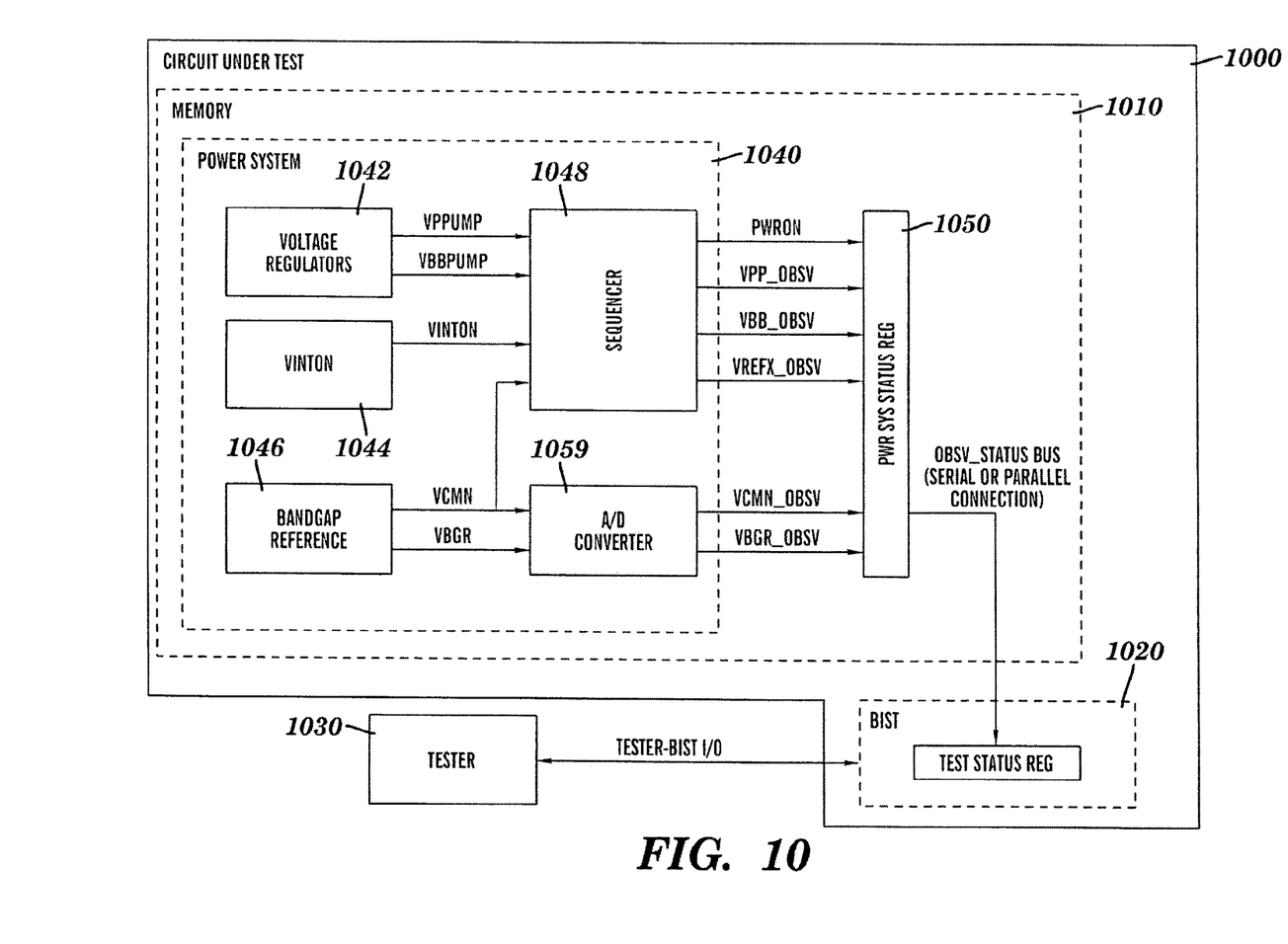
FIG. 10 is a block diagram of a test system of a chip including an on-chip power supply system having multiple power supplies according to an exemplary embodiment.

FIG. 10 is a block diagram of a test system of a chip including an on-chip power supply system having multiple power supplies according to an exemplary embodiment. In FIG. 10, a circuit under test 1000 includes a memory 1010, a power system 1040 including multiple power supplies, a power system status register 1050, and a BIST 1020. The circuit under test 1000 is connected to a tester 1030 via a tester-BIST link.

The power system 1020 includes voltage regulators 1022, and a VINTON source 1044 inputting voltage signals into a sequencer 1025 as described above with reference to FIGS. 1-3. The power system also includes a bandgap reference voltage source 1026 inputting information voltage information into the sequencer 1025 and into an A/D converter 1059. The sequencer 1050 generates digital signals indicating status of the power supplies, i.e., compliance signals. The A/D converter 1059 also generates digital compliance signals. The digital compliance signals are input into the power system status register 1050. The power system status register 1050, in turn, outputs a power supply status signal indicating status of the multiple power supplies to a test status register in the BIST 1020 via a status bus.

As explained above with reference to FIGS. 4-9B, the BIST 1020 determines whether the power supply system is failing based on the power system status signal. If not, the BIST conducts memory tests and generates pass/fail indicators for the memories. The pass/fail indicators are stored in the test status register. If the power supply is failing, the BIST aborts memory testing and stores a failure indicator in the test status register. In this manner the status of the power supply has an effect on test flow.

The pass/fail indicators are passed to the tester 1030, which diagnoses chip failure based on various factors, including the BIST memory test results. Chips may have different criteria for passing. For example, all memories must pass for a chip to pass, or only a certain number of memories must pass for a chip to pass.

Chip failure diagnosis is made easier, according to exemplary embodiments, because power status information of analog power supplies is made readily available. This makes it easier to diagnose problems with analog circuitry on the chip, as it avoids inferring from a failed memory test that there might be an analog circuit (power supply) issue. According to exemplary embodiments, rather than running extensive (and time consuming) BIST tests only to find that there appear to be issues with underlying analog circuits, the status of the analog circuits may be queried beforehand. If analog circuits are failing a chip failure determination can be made quickly and testing may be terminated early.

The above embodiments describe a method for accessing the power system status in a simple manner. The health of a chip can be assessed in the field, or upon field return through simple test procedures. This can be vital in diagnosing and dealing with field or process issues that create failures in analog circuitry. Typically, these failures manifest themselves as failures in downstream logic or testing processes. The problem is in identifying the root cause or source of the fail signature to aid in debug. Often times, many different circuit failures can generate the same system level fail signature. In large systems, analog circuit failures can create memory write/read failures that are detected as system level data errors (which have many possible sources). Determining the failing circuit on a large system is difficult and expensive without good diagnostics. According to exemplary embodiments, BIST or scan diagnostics are extended to include status information of previously unobservable circuits. A check of this status information upon system failure can provide a quick check of multiple, isolated circuit blocks. This can isolate the root cause to a small subset of the total system, saving time and money in debug efforts.

While exemplary embodiments have been described above, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for indicating status of an on-chip power supply system including multiple power supplies, comprising:
a power system status register for receiving digital compliance signals, each compliance signal associated with one of the multiple power supplies, each power supply having an associated compliance level, wherein each digital compliance signal indicates whether its associated power supply is operating at the associated compliance level, and wherein the power system status register generates a power supply status signal based on the digital compliance signals indicating status of the digital compliance signals associated with the power supplies; and
an output for outputting the power supply status signal, wherein if a power supply is operating at its associated compliance level, the power supply status signal indicates that the power supply is passing, and if the power supply is not operating at its associated compliance level, the power supply status signal indicates that the power supply is failing, wherein the power supply status signal is fed into Built-in Self Test (BIST) system via a latched interface or a scan chain, and wherein the BIST performs tests on memories on the chip based on the power supply status signal.

2. The system of claim 1, wherein if the power supply status signal indicates that any of the power supplies is not operating at its compliance level, all of the power supplies are determined to be failing.

3. The system of claim 1, further comprising a sequencer circuit for activating the multiple on-chip power supplies in a predetermined order, wherein the sequencer circuit provides a digital compliance signal for each power supply.

4. The system of claim 1, further comprising an analog-to-digital converter for converting analog signals indicating operating levels of power supplies into digital compliance signals.

5. The system of claim 1, wherein if the power supply status signal indicates that a power supply that supplies power to a memory on the chip is failing, a BIST memory test is aborted.

6. The system of claim 1, wherein if the power supply status signal indicates that the power supplies that supply power to the memories on the chip are passing, the BIST system tests performance of the memories and generates memory status indicators indicating whether the memories pass or fail.

7. The system of claim 6, wherein the power supply status signal is combined with memory status indicators and fed to a testing circuit for diagnosing failure of the chip.

8. The system of claim 6, wherein spare memories are used in place of memories indicated as failing.

9. A system for indicating status of an on-chip power supply system including multiple power supplies, comprising:
a sequencer circuit for activating the multiple power supplies in a predetermined order, wherein the sequencer circuit provides a digital compliance signal for each power supply indicating whether the power supply is operating at an associated compliance level;
an analog-to-digital converter for converting analog signals indicating operating levels of power supplies into digital compliance signals indicating whether the power supplies are operating at associated compliance levels;
a power system status register coupled for receiving the digital compliance signals from the sequencer circuit and the analog-to-digital converter and generating a power supply status signal based on the digital compliance signals indicating status of the digital compliance signals associated with the power supplies, wherein if a power supply is operating at its associated compliance level, the power supply status signal indicates that the power supply is passing, and if the power supply is not operating at its associated compliance level, the power supply status signal indicates that the power supply is failing; and
a Built-in Self Test (BIST) system that receives the power supply status signal via a latched interface or a scan chain, wherein the BIST performs tests on memories on the chip based on the power supply status signal.

10. The system of claim 9, wherein if the power supply status signal indicates that any of the power supplies is not operating at its compliance level, all of the power supplies are determined to be failing.

11. The system of claim 9, wherein if the power supply status signal indicates that a power supply that supplies power to a memory on the chip is failing, a BIST memory test is aborted.

12. The system of claim 9, wherein if the power supply status signal indicates that the power supplies that supply power to the memories on the chip are passing, the BIST system tests performance of the memories and generates memory status indicators indicating whether the memories pass or fail.

13. The system of claim 12, wherein the power supply status signal is combined with the memory status indicators and fed to a testing circuit for diagnosing failure of the chip.

14. The system of claim 12, wherein spare memories are used in place of memories indicated as failing.

15. A method for indicating status of an on-chip power supply system including multiple power supplies, comprising:
receiving digital compliance signals, each compliance signal associated with one of multiple on-chip power supplies, each power supply having an associated compliance level, wherein each compliance signal indicates whether its associated power supply is operating at the associated compliance level;
generating a power supply status signal based on the digital compliance signals indicating status of the digital compliance signals associated with the power supplies;
outputting the power supply status signal, wherein if a power supply is operating at its associated compliance level, the power supply status signal indicates that the power supply is passing, and if the power supply is not operating at is associated compliance level, the power supply status signal indicates that the power supply is failing; and
feeding the power supply status signal into a Built-in Self Test (BIST) system via a latched interface or a scan chain, and performing a BIST test on memories on the chip based on the power supply status signal.

16. The method of claim 15, wherein if the power supply status signal indicates that any of the power supplies is not operating at its compliance level, all of the power supplies are determined to be failing.

17. The method of claim 15, wherein if the power supply status signal indicates that a power supply that supplies power to a memory on the chip is failing, the BIST memory test is aborted, or if the power supply status signal indicates that the power supply that supplies power to the memories on the chip are passing, the BIST system tests performance of the memories and generates memory status indicators indicating whether the memories pass or fail, wherein spare memories are used in place of memories indicated as failing.

18. The method of claim 17, further comprising combining the power supply status signal with the memory status indicators and feeding the combined signal to a testing circuit for diagnosing failure of the chip.

* * * * *